(12) United States Patent
Zhang et al.

(10) Patent No.: US 11,282,904 B2
(45) Date of Patent: Mar. 22, 2022

(54) ORGANIC LIGHT EMITTING DIODE DISPLAY DEVICE, METHOD OF MANUFACTURING THE OLED DISPLAY DEVICE, AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventors: Ming Zhang, Wuhan (CN); Jie Yang, Wuhan (CN)

( * ) Notice: Subject to any disclaimer, the term of this patent is extended or adjusted under 35 U.S.C. 154(b) by 247 days.

(21) Appl. No.: 16/495,402

(22) PCT Filed: May 15, 2019

(86) PCT No.: PCT/CN2019/086953
§ 371 (c)(1),
(2) Date: Sep. 19, 2019

(87) PCT Pub. No.: WO2020/191891
PCT Pub. Date: Oct. 1, 2020

(65) Prior Publication Data
US 2021/0280646 A1    Sep. 9, 2021

(30) Foreign Application Priority Data

Mar. 27, 2019    (CN) .......................... 201910236011.2

(51) Int. Cl.
*H01L 27/32*    (2006.01)
*H01L 51/52*    (2006.01)
*H01L 51/56*    (2006.01)

(52) U.S. Cl.
CPC ...... *H01L 27/3234* (2013.01); *H01L 51/5237* (2013.01); *H01L 51/56* (2013.01)

(58) Field of Classification Search
None
See application file for complete search history.

(56) References Cited

U.S. PATENT DOCUMENTS

| 2017/0031323 | A1* | 2/2017 | Kim | H01L 27/3258 |
| 2017/0162637 | A1* | 6/2017 | Choi | G09G 3/20 |
| 2018/0151834 | A1* | 5/2018 | Kanaya | H01L 29/78666 |

FOREIGN PATENT DOCUMENTS

| CN | 106409867 A | 2/2017 |
| CN | 107452894 A | 12/2017 |
| CN | 108288634 A | 7/2018 |
| CN | 108666347 A | 10/2018 |
| CN | 109671864 A | 4/2019 |
| CN | 109801956 A | 5/2019 |

* cited by examiner

*Primary Examiner* — Michelle Mandala

(57) ABSTRACT

The present disclosure provides an organic light emitting diode (OLED) display device, method of manufacturing the OLED display device, and an electronic device. Using an isolation portion for isolating a first light emitting device layer located at a side of the isolation portion closed to the display region from a second light emitting device layer located at a side of the isolation portion closed to the a through-hole. And using an encapsulation layer covering the light emitting device layer, the isolation portion, and the substrate to make the OLED display device has a high screen ratio while having good package reliability.

11 Claims, 4 Drawing Sheets

ORGANIC LIGHT EMITTING DIODE DISPLAY DEVICE, METHOD OF MANUFACTURING THE OLED DISPLAY DEVICE, AND ELECTRONIC DEVICE

FIELD OF INVENTION

The present disclosure relates to the field of display technology, in particular to organic light emitting diode display device, method of manufacturing the OLED display device, and an electronic device.

BACKGROUND OF INVENTION

Organic light-emitting diodes (OLEDs) have been favored by the public and developers because of their self-illumination, high contrast, wide viewing angles, low power consumption, and flexibility. For display devices, such as mobile phones, increasing their screen ratio to improve appearance has become mainstream current design. In addition to the display area for display, the mobile phone also needs components such as a camera, an earpiece, and a microphone to realize functions such as taking photos and voice calls. The camera, the earpiece, and the microphone reduce the screen ratio of the mobile phone.

At present, the use of laser cutting technology to achieve the screen camera is one of the ways to increase the screen ratio. However, for the organic light emitting diode display device, the laser cutting technology may cause the package reliability to deteriorate, thereby affecting display effect of the organic light emitting diode display device.

Therefore, it is necessary to propose a technical solution to make the organic light emitting diode display device have a high screen ratio while having good package reliability.

SUMMARY OF INVENTION

The propose of the present disclosure is providing an organic light emitting diode display device, method of manufacturing the organic light emitting diode (OLED) display device, and electronic device, the OLED display device have a high screen ratio while having good package reliability.

An organic light emitting diode display device, the organic light emitting diode display device comprises:

a substrate having a hollow region, a display region located at an outside of the hollow region, and a non-display region located between the hollow region and the display region;

at least one isolation portion disposed on the substrate of the non-display region, wherein the at least one isolation portion is used for isolating a first light emitting device layer from a second light emitting device layer;

a light emitting device layer which comprises the first light emitting device layer and the second light emitting device layer, the first light emitting device layer formed on a side of the isolation portion of the substrate close to the display region, the second light emitting device layer formed on a side of the isolation portion of the substrate close to the hollow region;

an encapsulation layer covering the light emitting device layer, the isolation portion, and the substrate;

a through-hole located in the hollow region and extending through the substrate, the second light emitting device layer, and the encapsulation layer.

In the OLED display device described above, the isolation portion comprises a first isolation portion and a second isolation portion, the first isolation portion located at a side close to the display region, the second isolation portion located at a side close to the through-hole.

In the OLED display device described above, a distance between the first isolation portion and the second isolation portion is greater than 100 micrometers.

In the OLED display device described above, the OLED display device further comprises a barrier portion disposed on the non-display region of the substrate, the barrier portion and the isolation portion are disposed in the same layer and located between the first isolation portion and the second isolation portion, a height of the barrier portion is smaller than a height of the first isolation portion and a height of the second isolation portion.

In the OLED display device described above, there are a plurality of barrier portions, and the plurality of barrier portions are disposed between the first isolation portion and the second isolation portion and have tall and short barrier portions alternate with each other.

In the OLED display device described above, a longitudinal section of the barrier portion has one of following shapes: a triangle, a semicircle, a trapezoid, a rectangle, or an irregular shape.

In the OLED display device described above, the encapsulation layer comprises an inorganic layer covering the light emitting device layer, the isolation portion, and the substrate.

In the OLED display device described above, the inorganic layer is formed by atomic layer deposition or atomic layer implantation.

In the above OLED display device, a longitudinal section of the isolation portion has a shape of an inverted trapezoid.

A method of manufacturing the organic light emitting diode (OLED) display device, wherein the manufacturing method comprises the following steps:

providing a substrate having a hollow region, a display region located at an outside of the hollow region, and a non-display region located between the hollow region and the display region;

forming at least one isolation portion disposed on the substrate of the non-display region, wherein the at least one isolation portion is used for a first light emitting device layer and from a second light emitting device layer;

forming a light emitting device layer on the substrate, the light emitting device layer which comprises the first light emitting device layer and the second light emitting device layer, the first light emitting device layer formed on a side of the isolation portion of the substrate close to the display region, the second light emitting device layer formed on a side of the isolation portion of the substrate close to the hollow region;

forming an encapsulation layer covering the light emitting device layer, the isolation portion, and the substrate;

forming a through-hole located in the hollow region and extending through the substrate, the second light emitting device layer, and the encapsulation layer.

In The method of manufacturing the OLED display device described above, the isolation portion comprises a first isolation portion and a second isolation portion, the first isolation portion located at a side close to the display region, the second isolation portion located at a side close to the through-hole.

In The method of manufacturing the OLED display device described above, a distance between the first isolation portion and the second isolation portion is greater than 100 micrometers.

In The method of manufacturing the OLED display device described above, the manufacturing method further comprises forming a barrier portion between the first isolation portion and the second isolation portion, the barrier portion and the isolation portion are disposed in the same layer and located between the first isolation portion and the second isolation portion, a height of the barrier portion is smaller than a height of the first isolation portion and a height of the second isolation portion.

In The method of manufacturing the OLED display device described above, there are a plurality of barrier portions, the plurality of barrier portions are disposed between the first isolation portion and have tall and short barrier portions alternate with each other.

In The method of manufacturing the OLED display device described above, a longitudinal section of the barrier portion has one of following shapes: a triangle, a semicircle, a trapezoid, a rectangle, or an irregular shape.

In The method of manufacturing the OLED display device described above, the manufacturing method further comprises forming a first inorganic insulating layer covering the light emitting device layer, the isolation portion, and the substrate.

In The method of manufacturing the OLED display device described above, the first inorganic insulating layer is formed by atomic layer deposition or atomic layer implantation.

In The method of manufacturing the OLED display device described above, a longitudinal section of the isolation portion has a shape of an inverted trapezoid.

An electronic device, wherein the electronic device comprising the OLED display device described above and a camera, the camera embedded in the through-hole of the OLED display device.

The present disclosure provides an organic light emitting diode display device, method of manufacturing the OLED display device, and electronic device. Using the isolation portion for isolating a first light emitting device layer located at a side of the isolation portion close to the display region from a second light emitting device layer located at a side of the isolation close to the a through-hole. And using an encapsulation layer covering the light emitting device layer, the isolation portion, and the substrate to make the OLED display device has a high screen ratio while having good package reliability.

DETAILED DESCRIPTION OF PREFERRED EMBODIMENTS

The following description of the various embodiments is provided to clearly and completely describe the technical solutions in the embodiments of the present disclosure with the accompanying drawings. Obviously, the described embodiments are only a part of the embodiments of the present disclosure. Based on the embodiments of the present disclosure, those embodiments which make from the skilled in the art without any inventive efforts are within the scope of the present disclosure.

Figure 1:
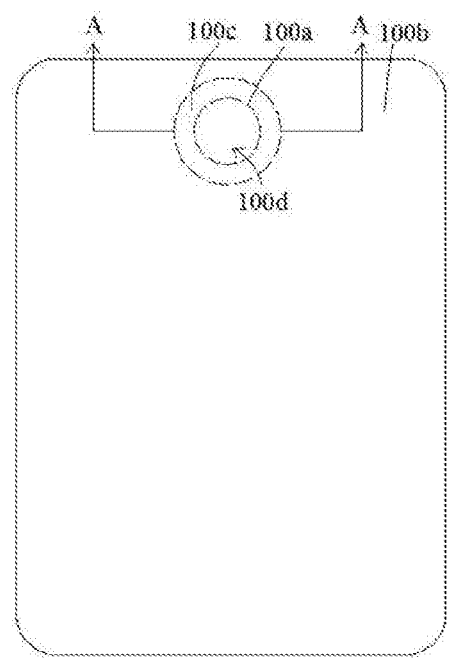
FIG. 1 is a top diagram of an organic light emitting diode (OLED) display device according to an embodiment of the present disclosure.

Please refer to FIG. 1, which is a top view of an organic light emitting diode display device according to an embodiment of the present application. The organic light emitting diode (OLED) display device has a hollow region 100a, a display region 100b, and a non-display region 100c. The display region 100b is for displaying an image, and the display area 100b is located at an outside of the hollow region 100a. The hollow region 100a may be located in the central of the display region 100b, or may be located at a corner of the display region 100b. The hollow region 100a has a through-hole 100d extending through the thickness direction of the OLED display device, and the through-hole 100d is used to set an optical device such as a camera to make the OLED display device achieves a high screen ratio. The non-display region 100c is located between the hollow region 100a and the display region 100b.

Figure 2:
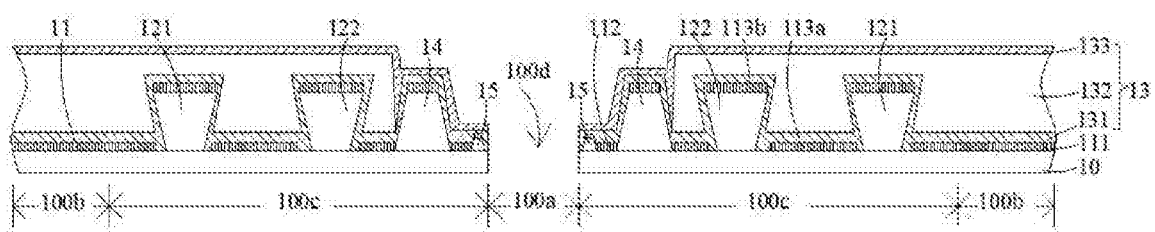
FIG. 2 is a first sectional diagram along a tangent A-A of the OLED display device shown in FIG. 1.

Please refer to FIG. 2, which is a first sectional diagram along a tangent A-A of the OLED display device shown in FIG. 1. The OLED display device includes a substrate 10, a light emitting device layer 11, at least one isolation portion, an encapsulation layer 13, a retaining wall 14, a crack resistant portion 15, and a through-hole 100d.

The substrate 10 having a hollow region 100a, a display region 100b located at an outside of the hollow region 100a, and a non-display region 100c located between the hollow region 100a and the display region 100b. The substrate 10 may be a glass substrate, a flexible substrate, and a flexible substrate. The flexible substrate may be a polyimide substrate or a polyethylene terephthalate substrate.

The light emitting device layer 11 is for generating visible light to display an image. Since the at least one isolation portion is formed on the substrate 10 before the formation of the light emitting device layer 11, wherein the at least one isolation portion is used for isolating the light emitting device layer 11 into a first light emitting device layer 111 and a second light emitting device layer 112, the first light emitting device layer 111 and the second light emitting layer are formed by the same process and formed in the same layer. The first light emitting device layer 111 is formed on a side of the isolation portion of the substrate 10 close to the display region 100b, the second light emitting device layer 112 formed on a side of the isolation portion of the substrate 10 close to the hollow region 100a. Specifically, the first light emitting device layer 111 covers a portion of the substrate 10 located at the display region 100b and covers a portion of the substrate 10 located at a portion of the non-display region 100c. The second light emitting device layer 112 covers a portion of the substrate 10 located at the non-display region 100c, and is formed on the retaining wall 14 and the crack resistant portion 15. The light emitting device layer 11 which further includes a third light emitting device layer 113a formed on a portion of substrate 10 between a first isolation portion 121 and a second isolation portions 122, and a fourth light emitting device layer 113b formed on the insulating portion. The light emitting device layer 11 is an organic light emitting diode layer. The organic light emitting diode includes an anode, a cathode, and an organic light emitting layer between the anode and the cathode. A hole transport layer and/or a hole injection layer may also be disposed between the anode and the organic light-emitting layer, and an electron transport layer and/or an electron injection layer may be disposed between the cathode and the organic light-emitting layer. The material for manufacturing the anode may be metal and/or indium tin oxide. The material for manufacturing the cathode may be metal and/or indium tin oxide. The material of metal includes, but are not limited to silver and magnesium. The organic light emitting layer may include a red organic light emitting material, a green organic light emitting material, a blue organic light emitting material, and a white organic light emitting material. Since the organic light-emitting material and the metal constituting the cathode or the anode are sensitive to water vapor and oxygen, it is necessary to isolate the light emitting device layer from water vapor and oxygen to increase the life time of the organic light-emitting diode display device.

Figure 3:
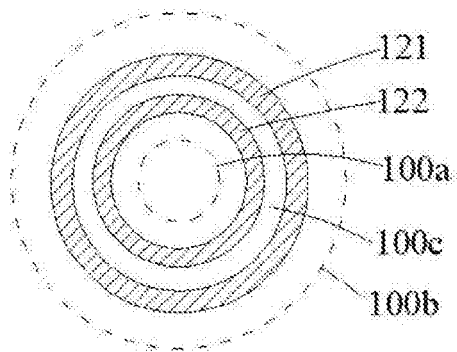
FIG. 3 is a top diagram of the isolation portion of the OLED display device shown in FIG. 2.

Please refer to FIG. 2 and FIG. 3, FIG. 3 is a top diagram of the isolation portion of the OLED display device shown in FIG. 2. The isolation portion is used to isolate the first light emitting device layer 111 from the second light emitting device layer 112, to prevent water vapor, oxygen, or the like are transmitted from the second light emitting device layer 112 of the non-display region 100c to the first light emitting device layer 111 of the display region 100b, affects the life time and display effect of the OLED display device. The number of the isolation portion may be plural, and are disposed around the hollow region 100a. A longitudinal section of the isolation portion has a shape of an inverted trapezoid, and the longitudinal section of the isolation portion may have others shape which upper is wide and lower is narrow. The isolation portion disposed on the substrate 10 located at the non-display area 100c. The isolation portion includes a first isolation portion 121 and a second isolation portion 122. The first isolation portion 121 located at a side close to the display region 100b, the second isolation portion 122 located at a side close to the through-hole 100d. A height of the first isolation portion 121 same as a height of the second isolation portion 122. The first isolation portion 121 and the second isolation portion 122 are annular shape, the second isolation portion 122 is disposed around the hollow region 100a, the first isolation portion 121 is disposed around the second isolation portion 122. A distance between the first isolation portion 121 and the second isolation portion 122 is greater than 100 micrometers, to ensure an effective lateral packaging path of encapsulating the encapsulation layer 13 of the light emitting device layer 11. The second isolation portion 122 also functions to block water vapor and oxygen. The material of manufacturing the isolation portion is an organic material, and the isolation portion is manufactured by exposing and developing negative photoresist material. A height of the isolation portion is from 0.5 μm to 10 μm.

The encapsulation layer 13 is used to encapsulate the light emitting device layer 11. The encapsulation layer 13 covers the light emitting device layer 11, the isolation portion, and the substrate 10. The encapsulation layer 13 includes a first inorganic insulating layer 131, a first organic insulating layer 132, and a second inorganic insulating layer 133. The first inorganic insulating layer 131 is formed by an excellent step cover process so that the first inorganic insulating layer 131 can cover the entire light emitting device layer 11 while covering the entire isolation portion, including a side of the isolation portion to formed a continuous first inorganic insulating layer 131, thereby improving package reliability of the light emitting device layer 11. The first inorganic insulating layer 131 is formed by an excellent step cover process such as atomic layer deposition or atomic layer implantation. The first inorganic insulating layer 131 is at least one of silicon nitride layer, silicon oxide layer, silicon oxynitride layer, and aluminum oxide layer. The first organic insulating layer 132 is formed on a surface of the first inorganic insulating layer 131, the first organic insulating layer 132 is used to flat a surface of the encapsulation layer 13. The first organic insulating layer 132 may be formed by inkjet printing. The second inorganic insulating layer 133 is formed on a surface of the first organic insulating layer 132, and the second inorganic insulating layer 133 may be at least one of silicon nitride layer, silicon oxide layer, silicon oxynitride layer, and aluminum oxide layer. The second inorganic insulating layer 133 may be formed by one of chemical vapor deposition, atomic layer deposition, atomic layer implantation, sputter deposition, pulsed laser deposition, and plasma enhanced vapor deposition.

The retaining wall 14 is used to block the organic insulating layer in the encapsulating layer 13 from the organic insulating layer over flow, such as the first organic insulating layer 132 in the encapsulating layer 13. The retaining wall 14 is disposed on a portion of the substrate 10 located at the non-display area 100c and located on a side of the isolation portion close to the hollow region 100a. A longitudinal section of the retaining wall 14 has a trapezoidal shape, the retaining wall 14 is annular shape, which surrounds the hollow region 100a. Material for manufacturing the retaining wall 14 may be an inorganic material or an organic material.

The crack resistant portion 15 is used to prevent breakage of the film on the substrate 10, which is made of an inorganic material, and is formed by patterning the inorganic layer. The crack resistant portion 15 is disposed on a portion of the substrate 10 located at the non-display area 100c and located at aside of the retaining wall 14 close to the hollow region 100a.

The through-hole 100d is used for accommodating components such as a camera. The shape of the through-hole 100d may be a circle or other shape. The through-hole 100d is located at the hollow region 100a and penetrates through the substrate 10, the second light emitting device layer 112, and the encapsulation layer 13. The through-hole 100d is formed by laser ablation of a partial of the substrate 10 located at the hollow region 100a, the second light emitting device layer 112, and the encapsulation layer 13. When the laser ablation is performed to form the through-hole 100d, the crack resistant portion 15 can prevent crack propagation in the inorganic layer of the encapsulation layer 13.

In the OLED display device of the present disclosure, using the isolation portion to isolate the first light emitting device layer located at the side of the isolation portion close to the display region and the second light emitting device layer on the side of the isolation portion near to the through-hole, and using the encapsulation layer cover the light emitting device layer, the isolation portion, and the substrate to have a high screen ratio of the OLED display device while having good package reliability.

Figure 4:
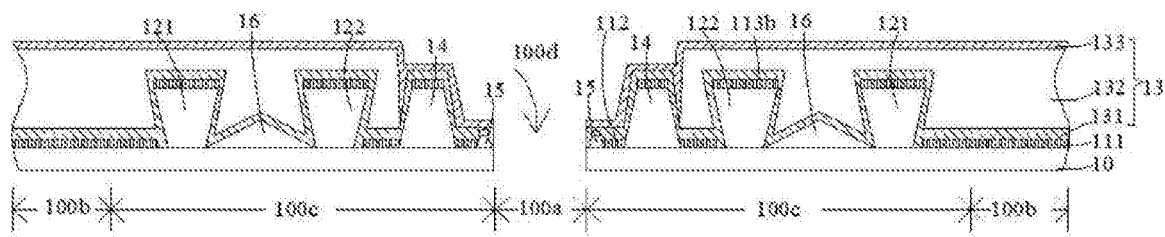
FIG. 4 is a second sectional diagram along a tangent A-A of the OLED display device shown in FIG. 1.

Please refer to FIG. 4, which is a second sectional diagram along a tangent A-A of the OLED display device shown in FIG. 1. The OLED display device shown in FIG. 4 is substantially similar to the OLED display device shown in FIG. 2, except that the OLED display device further includes a barrier portion 16 disposed on the substrate 10 of the non-display area 100c. The barrier portion 16 and the isolation portion are disposed in the same layer and located between the first isolation portion 121 and the second isolation portion 122. A height of the barrier portion 16 is smaller than a height of the first isolation portion 121 and a height of the second isolation portion 122. The barrier portion 16 is used to increase the lateral diffusion path of water vapor and oxygen, and is laterally parallel to a surface on partial of the substrate 10 which is disposed the isolation portion, thereby improving the package reliability of the OLED display device. The barrier portion 16 has annular shape, and the barrier portion 16 is disposed around the second isolation portion 122. A longitudinal section of the barrier portion 16 may has one of following shapes: a triangle, a semicircle, a trapezoid, a rectangle, or an irregular shape. Specifically, the barrier portion is triangular.

Figure 5:
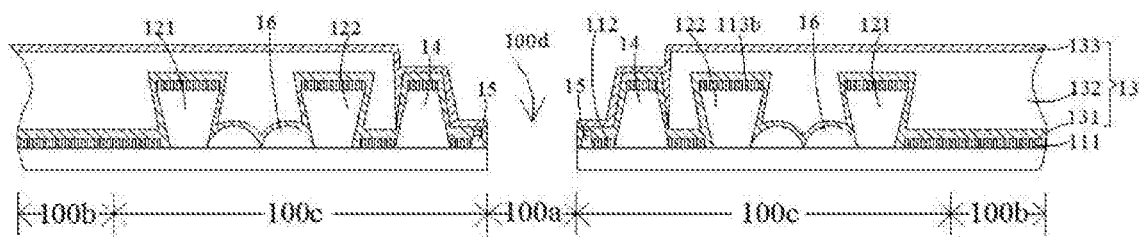
FIG. 5 is a third sectional diagram along a tangent A-A of the OLED display device shown in FIG. 1.

Please refer to FIG. 5, which is a third sectional diagram along a tangent A-A of the OLED display device shown in FIG. 1. The OLED display device shown in FIG. 5 is substantially similar to the OLED display device shown in FIG. 4, except that there are two barrier portion 16, and the longitudinal sections of the two barrier portions 16 are both have semicircular shape to further increase the lateral diffusion path of water vapor and oxygen, and to further improve the package reliability of the OLED display device. The two barrier portions 16 are have annular shape. It can be understood that, the number of the barrier portion 16 may be plural, and each of the plurality of barrier portions 16 has annular shape. A longitudinal section of each of the plurality of barrier portions 16 may have the same or different shape.

Figure 6:
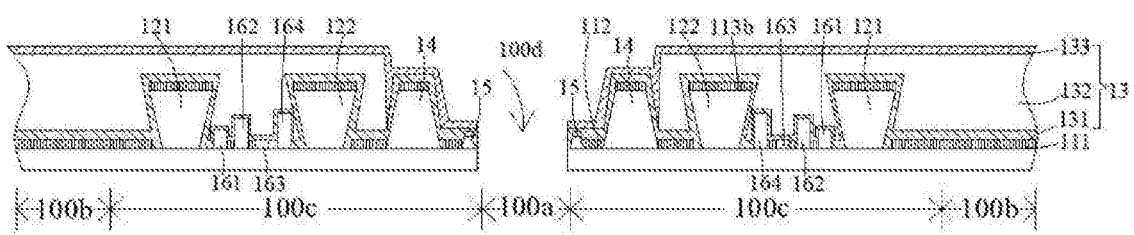
FIG. 6 is a fourth sectional diagram along a tangent A-A of the OLED display device shown in FIG. 1.

Please refer to FIG. 6, which is a fourth sectional diagram along a tangent A-A of the OLED display device shown in FIG. 1. The OLED display device shown in FIG. 5 is substantially similar to the OLED display device shown in FIG. 4, except that there are a plurality of barrier portions 16, the plurality of barrier portions 16 are disposed between the first isolation portion 121 and the second isolation portion 122 and have tall and short barrier portions alternate with each other. Specifically, the plurality of barrier portions 16 include a first barrier portion 161, a second barrier portion 162, a third barrier portion 163, and a fourth barrier portion 164. The first barrier portion 161 is disposed close to the first isolation portion 121, the fourth barrier portion 164 is disposed close to the second isolation portion 122, the second barrier portion 162 and the third barrier portion 163 are located between the first barrier portion 161 and the fourth barrier portion 164. The second barrier portion 162 is disposed close to the first barrier portion 161, the third barrier portion 163 is disposed close to the fourth barrier portion 164. A height of the first barrier portion 161 is greater than a height of the third barrier portion 163, a height of the second barrier portion 162 is greater than a height of the first barrier portion 161, and a height of the fourth barrier portion 164 is greater than a height of the second barrier portion 162. Longitudinal sections of the first barrier portion 161, the second barrier portion 162, the third barrier portion 163, and the fourth barrier portion 164 are all rectangular shape. The plurality of the barrier portions 16 have tall and short barrier portions alternate with each other, to further increase lateral diffusion paths of water vapor and oxygen, etc., thereby further improving package reliability.

Figure 7:
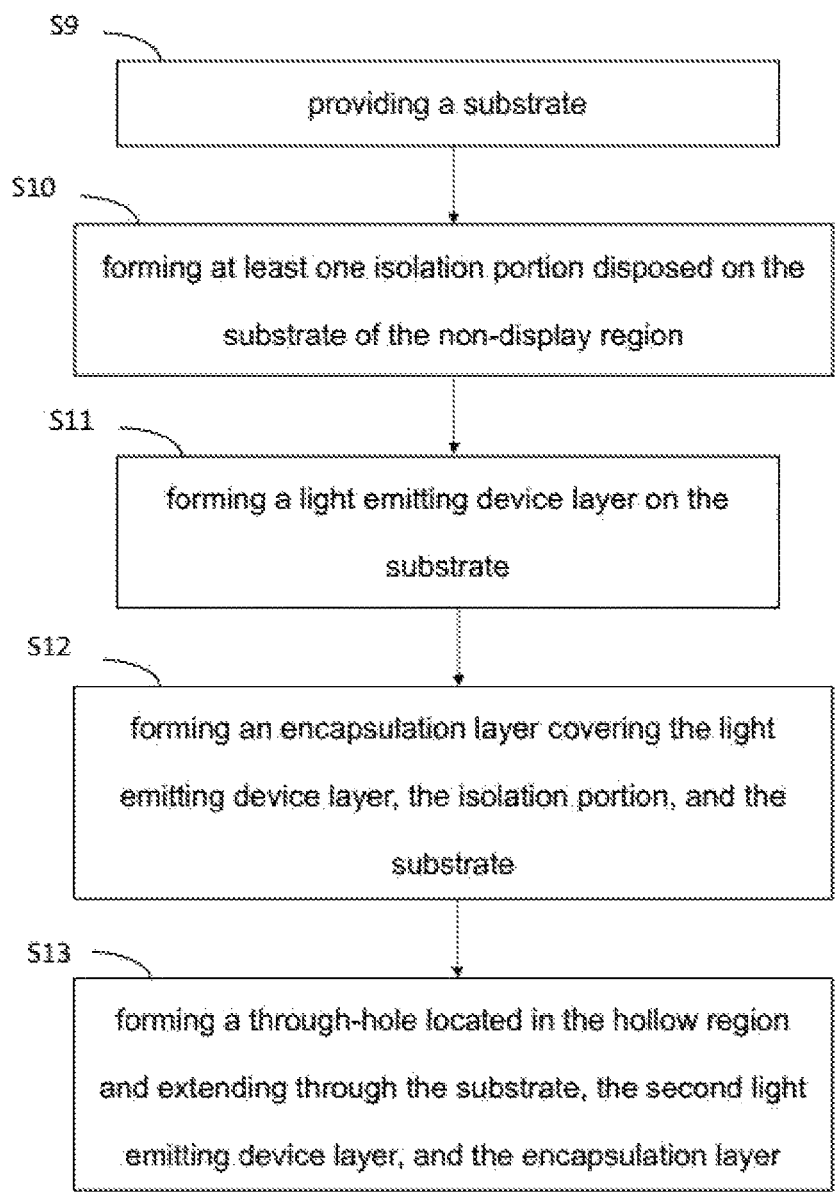
FIG. 7 is a flowchart diagram of a method of manufacturing an organic light emitting diode display device according to an embodiment of the present disclosure.

Please refer to FIG. 7, which is a flowchart diagram of a method of manufacturing an organic light emitting diode display device according to an embodiment of the present disclosure. The manufacturing method includes the following steps:

S10: providing a substrate.

Specifically, providing the substrate, the substrate may be a glass substrate, a flexible substrate, and a flexible substrate. The flexible substrate may be a polyimide substrate or a polyethylene terephthalate substrate. The substrate has a hollow region, a display region located at an outside of the hollow region, and a non-display region located between the hollow region and the display region.

S11: forming at least one isolation portion disposed on the substrate of the non-display region.

Specifically, forming an entire surface negative photoresist on the substrate, then exposing and developing the negative photoresist to form the isolation portion. The isolations have an annular shape, and the isolation portions are disposed around the hollow region. A longitudinal section of the isolation portion has a shape which upper is wide and lower is narrow, such as an inverted trapezoid. The isolating portion is used to break the subsequent formation of the light emitting device layer, to prevent water vapor, oxygen, or the like are transmitted from the second light emitting device layer of the non-display region to the first light emitting device layer of the display region, affects the life time and display effect of the OLED display device.

Specifically, the isolation portion includes a first isolation portion and a second isolation portion. The first isolation portion located at a side close to the display region, the second isolation portion located at a side close to the through-hole. A height of the first isolation portion same as a height of the second isolation portion. The first isolation portion and the second isolation portion are annular shape, the second isolation portion is disposed around the hollow region, the first isolation portion is disposed around the second isolation portion. A distance between the first isolation portion and the second isolation portion is greater than 100 micrometers, to ensure an effective packaging path in a lateral direction of encapsulating the encapsulation layer of the light emitting device layer. The lateral direction is laterally parallel to a surface on partial of the substrate which is disposed the partition portion. The second isolation portion also functions to block water vapor and oxygen.

S12: forming a light emitting device layer on the substrate.

Specifically, the anode is formed by sputtering deposition and a yellow light process, and the organic light emitting layer is formed by vacuum evaporation or inkjet printing, and the cathode is formed by sputtering deposition or vacuum evaporation. Since the isolation portion is formed on the substrate, the light emitting device layer is divided into the first light emitting device layer and the second light emitting device layer, and the first light emitting device layer is formed on the side of the isolation portion of the substrate close the display region, and the second light emitting device layer is formed on the side of the isolation portion of the substrate close to the hollow region. It should be noted that, when an evaporation process is used to form a film layer of the light emitting device layer. In the present disclosure, can use a vapor deposition cover corresponding to a panel outline to accomplish the corresponding vapor deposition of a corresponding film layer, therefore, a position of the evaporation mask corresponding the hollow region of the substrate does not need to be avoided.

S13: forming an encapsulation layer covering the light emitting device layer, the isolation portion, and the substrate.

Specifically, the first inorganic insulating layer is formed by atomic layer deposition or atomic layer implantation, to covering the light emitting device layer, the isolation portion, and the encapsulation layer of the substrate. Since the atomic layer deposition and the atomic layer implantation have good step coverage, the first inorganic insulating layer is continuously formed on the light emitting device layer, the isolation portion, and the substrate, and can perform a good encapsulation function.

Next, inkjet printing is used to form the first organic insulating layer on the first inorganic insulating layer.

Finally, by using any one of chemical vapor deposition, atomic layer deposition, atomic layer implantation, sputter deposition, pulsed laser deposition, and plasma enhanced vapor deposition, form the second inorganic insulating layer which cover the first organic insulating layer.

S14: forming a through-hole located in the hollow region and extending through the substrate, the second light emitting device layer, and the encapsulation layer.

Specifically, using laser to ablate the substrate of the hollow region, the second light emitting device layer, and the encapsulation layer to form the through-hole. The shape of the through-hole may be circular or other shape.

The method of manufacturing the OLED display device further includes forming a retaining wall and the crack resistant portion at the non-display region of the substrate. The retaining wall has annular shape, a longitudinal section of the retaining wall has trapezoidal shape, and the retaining wall is located at the side of the isolation portion close to the hollow region. The crack resistant portion is annular, and the crack resistant portion is located at the side of the retaining wall close to the hollow region.

The method of manufacturing the OLED display device further includes forming a barrier portion between the first isolation portion and the second isolation portion, the barrier portion being and the isolation portion are disposed in the same layer and located between the first isolation portion and the second isolation portion, the height of the barrier portion is smaller than the height of the first isolation portion and the second isolation portion. The barrier portion has an annular shape, the longitudinal section of the barrier portion has one of following shapes: a triangle, a semicircle, a trapezoid, a rectangle, or an irregular shape. There are a plurality of barrier portions, and the plurality of barrier portions are disposed between the first isolation portion and the second isolation portion and have tall and short barrier portions alternate with each other.

In the method of manufacturing the OLED display device of the present disclosure, using the isolation portion to isolate the first light emitting device layer located at the side of the isolation portion close to the display region and the second light emitting device layer on the side of the isolation portion near to the through-hole, and using the encapsulation layer cover the light emitting device layer, the isolation portion, and the substrate to have a high screen ratio of the OLED display device while having good package reliability.

The present disclosure also provides an electronic device, wherein the electronic device may be a mobile phone, a portable notebook or a monitoring device. The electronic device includes the above-described OLED display device and a camera. The camera is embedded in the through-hole of the organic light emitting diode display device.

The OLED display device of the electronic device of the embodiment of the present disclosure, using the isolation portion for isolating a first light emitting device layer located at a side of the isolation portion close to the display region from a second light emitting device layer located at a side of the isolation close to the a through-hole. And using an encapsulation layer covering the light emitting device layer, the isolation portion, and the substrate to make the OLED display device has a high screen ratio while having good package reliability, and extending the usage time of electronic device.

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

What is claimed is:

1. An organic light emitting diode (OLED) display device, wherein the organic light emitting diode display device comprises:
    a substrate having a hollow region, a display region located at an outside of the hollow region, and a non-display region located between the hollow region and the display region;
    at least one isolation portion disposed on the substrate located at the non-display region, wherein the at least one isolation portion is used for isolating a first light emitting device layer from a second light emitting device layer;
    a light emitting device layer which comprises the first light emitting device layer and the second light emitting device layer, the first light emitting device layer formed on a side of the isolation portion of the substrate close to the display region, the second light emitting device layer formed on a side of the isolation portion of the substrate close to the hollow region;
    an encapsulation layer covering the light emitting device layer, the isolation portion, and the substrate; and
    a through-hole located in the hollow region and extending through the substrate, the second light emitting device layer, and the encapsulation layer;
    wherein the isolation portion comprises a first isolation portion and a second isolation portion, the first isolation portion located at a side close to the display region, the second isolation portion located at a side close to the through-hole, a distance between the first isolation portion and the second isolation portion is greater than 100 micrometers; and
    wherein the OLED display device further comprises a plurality of barrier portions disposed on the non-display region of the substrate, the plurality of barrier portions and the isolation portion are disposed in the same layer, and the plurality of barrier portions located between the first isolation portion and the second isolation portion and have tall and short barrier portions alternating with each other, and wherein a height of each of the barrier portions is less than a height of the first isolation portion and a height of the second isolation portion.

2. The OLED display device according to claim 1, wherein a longitudinal section of the barrier portion has one of following shapes: a triangle, a semicircle, a trapezoid, a rectangle, or an irregular shape.

3. The OLED display device according to claim 1, wherein the encapsulation layer comprises an inorganic layer covering the light emitting device layer, the isolation portion, and the substrate.

4. The OLED display device according to claim 3, wherein the inorganic layer is formed by atomic layer deposition or atomic layer implantation.

5. The OLED display device according to claim 1, wherein a longitudinal section of the isolation portion has a shape of an inverted trapezoid.

6. A method of manufacturing the organic light emitting diode (OLED) display device, wherein the manufacturing method comprises the following steps:

providing a substrate having a hollow region, a display region located at an outside of the hollow region, and a non-display region located between the hollow region and the display region;

forming at least one isolation portion disposed on the substrate of the non-display region, wherein the at least one isolation portion is used for a first light emitting device layer and from a second light emitting device layer;

forming a light emitting device layer on the substrate, the light emitting device layer which comprises the first light emitting device layer and the second light emitting device layer, the first light emitting device layer formed on a side of the isolation portion of the substrate close to the display region, the second light emitting device layer formed on a side of the isolation portion of the substrate close to the hollow region;

forming an encapsulation layer covering the light emitting device layer, the isolation portion, and the substrate; and forming a through-hole located in the hollow region and extending through the substrate, the second light emitting device layer, and the encapsulation layer;

wherein the isolation portion comprises a first isolation portion and a second isolation portion, the first isolation portion located at a side close to the display region, the second isolation portion located at a side close to the through-hole, a distance between the first isolation portion and the second isolation portion is greater than 100 micrometers; and wherein the manufacturing method further comprises forming a plurality of barrier portions on the non-display region of the substrate, the plurality of barrier portions and the isolation portion are disposed in the same layer, and the plurality of barrier portions located between the first isolation portion and the second isolation portion and have tall and short barrier portions alternating with each other, and wherein a height of each of the barrier portions is less than a height of the first isolation portion and a height of the second isolation portion.

7. The method of manufacturing the OLED display device according to claim 6, wherein a longitudinal section of the barrier portion has one of following shapes: a triangle, a semicircle, a trapezoid, a rectangle, or an irregular shape.

8. The method of manufacturing the OLED display device according to claim 6, wherein the manufacturing method further comprises forming a first inorganic insulating layer covering the light emitting device layer, the isolation portion, and the substrate.

9. The method of manufacturing the OLED display device according to claim 8, wherein the first inorganic insulating layer is formed by atomic layer deposition or atomic layer implantation.

10. The method of manufacturing the OLED display device according to claim 6, wherein a longitudinal section of the isolation portion has a shape of an inverted trapezoid.

11. An electronic device, wherein the electronic device comprising the OLED display device according to claim 1 and a camera, the camera embedded in the through-hole of the OLED display device.

* * * * *